(12) United States Patent
Doppke et al.

(10) Patent No.: US 9,673,764 B2
(45) Date of Patent: Jun. 6, 2017

(54) AMPLIFIER CIRCUIT, RADIO FREQUENCY RECEIVER AND MOBILE TELECOMMUNICATIONS DEVICE

(71) Applicant: Intel IP Corporation, Santa Clara, CA (US)

(72) Inventors: Harald Doppke, Muelheim an der Ruhr (DE); Vadim Issakov, Duesseldorf (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/858,088

(22) Filed: Sep. 18, 2015

(65) Prior Publication Data

US 2016/0173035 A1 Jun. 16, 2016

(30) Foreign Application Priority Data

Dec. 15, 2014 (DE) .......... 10 2014 118 684

(51) Int. Cl.
*H03F 1/22* (2006.01)
*H03F 3/193* (2006.01)
*H03F 3/45* (2006.01)
*H03F 3/21* (2006.01)

(52) U.S. Cl.
CPC .......... *H03F 3/193* (2013.01); *H03F 1/223* (2013.01); *H03F 3/211* (2013.01); *H03F 3/45188* (2013.01); *H03F 2200/411* (2013.01); *H03F 2200/451* (2013.01)

(58) Field of Classification Search
CPC . H03F 1/22; H03F 1/223; H03F 1/226; H03F 3/16; H03F 3/68
USPC .......................... 330/277, 310, 311
See application file for complete search history.

(56) References Cited

U.S. PATENT DOCUMENTS

| | | | |
|---|---|---|---|
| 5,032,799 A * | 7/1991 | Milberger | H03F 1/226 330/277 |
| 5,432,477 A | 7/1995 | Nishiyama et al. | |
| 5,926,068 A | 7/1999 | Harr | |
| 2007/0063758 A1 | 3/2007 | Allard et al. | |
| 2010/0225414 A1 | 9/2010 | Gorbachov | |
| 2011/0003563 A1 | 1/2011 | Gorbachov | |

OTHER PUBLICATIONS

Translation of German Office Action Dated Apr. 4, 2016, Application No. 10 2014 118 684.2.

* cited by examiner

*Primary Examiner* — Steven J Mottola
(74) *Attorney, Agent, or Firm* — Eschweiler & Potashnik, LLC

(57) ABSTRACT

An amplifier circuit, comprises a first amplifier stage contributing to a power of an amplified signal and a second amplifier stage contributing to the power of the amplified signal. The first amplifier stage and the second amplifier stage share a transistor.

16 Claims, 6 Drawing Sheets

AMPLIFIER CIRCUIT, RADIO FREQUENCY RECEIVER AND MOBILE TELECOMMUNICATIONS DEVICE

REFERENCE TO RELATED APPLICATION

This Application claims priority to German Application number 10 2014 118 684.2 filed on Dec. 15, 2014, the contents of which are incorporated by reference in their entirety.

FIELD

Examples relate to amplifier circuits, for example to amplifier circuits used to amplify a signal received in a wireless communication signal.

BACKGROUND

In wireless communication systems, low noise performance, high gain, high linearity, low power consumption and small area consumption of the semiconductor devices is desirable or required. In particular, in mobile telecommunication devices, as for example mobile handsets or the like, low power consumption and small area may be of importance since the devices or mobile phones are powered by batteries. Moreover, in a wireless receiver, the first amplifier within an amplifier chain may be required to generate as little noise as possible, at the same time providing a high gain to enable a low noise figure of the whole amplifier chain.

A cascoded common source amplifier is often used as a first amplification stage, which is essentially composed of two transistors in series, the first being operated in common source mode and the second being operated in common gate mode. The cascoded common source amplifier is also called cascode circuit herein. A cascode circuit may provide for an output voltage which is amplified with respect to the voltage input into the amplifier circuit. An amplifier stage may provide a voltage output or current output depending on the loading of the following stage.

In some applications, an output of an amplifier stage should be capable of driving subsequent mixers used to down-mix or down-convert a received radio frequency signal into a baseband signal. To this end, transconductance amplifiers may be used, which may also be seen as a voltage controlled current source. A transconductance amplifier may, for example, comprise two transistors connected in series, the transistors being made in complementary technology. That is, one transistor may be a PMOS-field effect transistor (FET), while the other transistor may be a NMOS-FET.

In order to provide considerable gain within an amplifier chain as well as desirable output characteristics, different amplifier types are sometimes connected in series or cascaded, the individual amplifiers requiring individual power supplies and biasing circuitry as well as a considerable amount of semiconductor area, which may be undesirable.

BRIEF DESCRIPTION OF THE DRAWINGS

Some embodiments of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples are shown by way of example in the figures and will herein be described in detail. It should be understood, however, that there is no intent to limit examples to the particular forms disclosed, but on the contrary, further examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which the examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
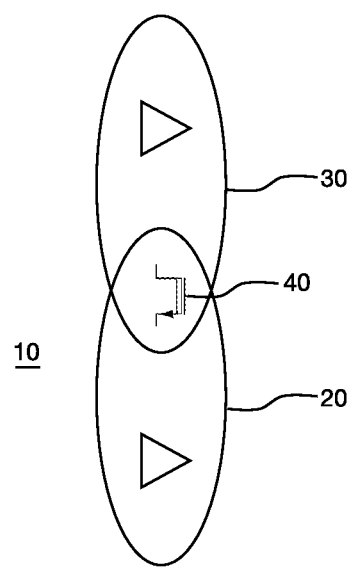
FIG. 1 illustrates an example of an amplifier circuit having two amplifier stages.

FIG. 1 illustrates a schematic illustration of an example of an amplifier circuit 10. The amplifier circuit 10 comprises a first amplifier stage 20 contributing to a power of an amplified signal and a second amplifier stage 30 contributing to the power of the amplified signal. The first amplifier stage 20 and the second amplifier stage 30 share a shared transistor 40 to provide their contribution to the power of the amplified signal.

The example illustrated in FIG. 1 uses the shared transistor 40 within first amplifier stage 20 as well as within a second amplifier stage 30. In other words, the shared transistor 40 is shared between first amplifier stage 20 and the second amplifier stage 30 to contribute to the functionality of both stages at the same time. The embodiments may, hence, allow saving chip area as compared to a cascaded two-stage approach using a first amplifier and a second amplifier in series. Hence, the examples described herein may, at least, save one additional transistor and its associated chip area. Further, the power supply or DC current path associated required for the second amplifier 30 stage may be saved since the power supply of the first amplifier stage 20 is also used (reused) for the second amplifier stage 30 due to the shared transistor 40 merging the two amplifier stages by its use within both. Hence, power consumption and semiconductor area may be saved at a time.

According to some examples, the at least one shared transistor 40 is used in a common gate mode within the first amplifier stage 20 and in a common source mode within the second amplifier stage 30. In using the shared transistor 40 in this manner does not only allow to merge the amplifier stages 20 and 30 to allow current reuse but to also increase the amplification or enhance the signal characteristic of the signal provided by means of both the first amplifier stage 20 and the second amplifier stage 30 may further increase the efficiency or the quality or power of the signal provided by an example of an amplifier circuit.

According to some examples, a signal tapped from the first amplifier stage 20 is used to drive the second amplifier stage 30 in order to provide an output signal of the amplifier circuit 10 based on a single input signal which is provided to the first amplifier stage 20 only. The driving signal to simultaneously drive the second amplifier stage 30 is generated within or provided by the first amplifier stage 20. Arbitrary input amplifier configurations may, for example, be used, provided that the driving signal to drive the second amplifier stage 30 is generated or tapped from the first amplifier stage such that a contribution of the first amplifier stage 20 and the contribution of the second amplifier stage 30 to the amplified signal superimpose in phase to assure, that the first amplifier stage 20 as well as the second amplifier stage 30 indeed contribute to the power of the amplified signal as opposed to configurations in which the contributions partly cancel each other. When tapping the input signal to drive the second amplifier stage 30 from within the first amplifier stage 20 is performed as indicated above, arbitrary input amplifier configurations may be used within the first amplifier stage 20. For example, inverting input amplifiers or non-inverting amplifiers may be used as well as input amplifiers having high impedance or input amplifiers having low impedance. Multiple applications with differing requirements may hence benefit from the advantages of the examples described herein due to its high flexibility.

Figure 2:
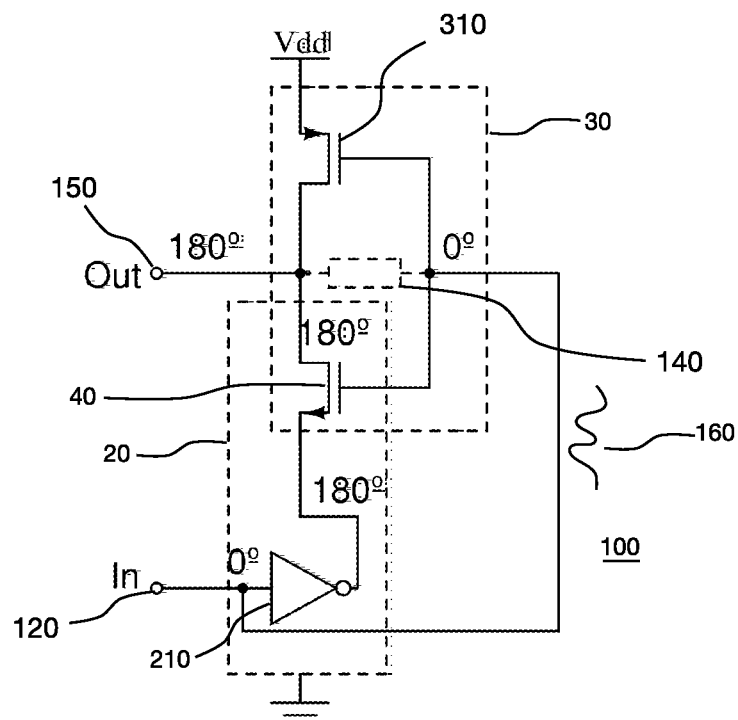
FIG. 2 shows an example of an amplifier circuit having an inverting input amplifier.

FIG. 2 illustrates an example of an amplifier circuit 100 having an inverting input amplifier 210. The first amplifier stage 20 of the amplifier circuit 100 comprises an input amplifier 210. The input amplifier 210 is inverting, that is, an output of the input amplifier 210 is inverted with respect to an input of the input amplifier 120 which is provided to the input amplifier 210 by means of an input terminal 120 of the amplifier circuit 100. An inverting amplifier is equivalent to an amplifier introducing a phase shift of 180°. One particular example of an inherently inverting input amplifier 210 would be a Field Effect Transistor operated in Common Source Mode. However, further input amplifiers and even integrated amplifier circuits may also be used as an input amplifier 210 of an example of an amplifier circuit 100. The shared transistor 40 of the amplifier circuit 100 is an N-MOS FET, having its source coupled to the output of the input amplifier 210. Within the first amplifier stage 20, the shared transistor 40 operates corresponding to a common gate mode since the input signal is provided to the source of the shared transistor 40. The shared transistor 40 within the first amplifier stage 20 of the example 100 serves a similar or an identical purpose than a transistor operated in common gate mode within a conventional cascode circuit, providing a high impedance output for the first amplifier stage 20. To this end, the first amplifier stage 20 of the example in FIG. 2 corresponds to a cascode stage.

A driving signal 160 tapped from the first amplifier stage 20 is used to drive the second amplifier stage 30. In the example of FIG. 2, the signal to drive the second amplifier stage 30 is tapped from the input of the first amplifier stage 20 and provided to the gate of the shared transistor 40 as well as to the gate of a second transistor 310 within the second amplifier stage 30. The source of the second transistor 310, which is a P-MOS FET is coupled to a positive supply voltage so that the second transistor 310 is operated in a common source configuration and has the functionality of an active load. Within the second amplifier stage 30, the shared transistor 40 also operates in common source mode, since the input signal is provided to the gate of the shared transistor 40. A transistor or FET in common source mode is inherently inverting, i.e. the signal at its output or drain is inverted with respect to the input signal provided at its gate. Therefore, the signal to drive the second amplifier stage 30 and the gates of the shared transistor 40 and the second transistor 310 therein are required to be not inverted with respect to the input signal to assure that the signal at the drain of the shared transistor 40 and the signal at the drain of the second transistor 310 exhibit the same phase so as to superimpose coherently. By using the signal provided to the input amplifier 210 to drive the second amplifier stage 30, it can be achieved that the first amplifier stage 20 as well as the second amplifier stage 30 indeed contribute to the power of the amplified signal at an output 150 of the amplifier circuit 100.

In a further optional example, the shared transistor 40 and the second transistor 310 may be self-biased by means of resistor 140 coupled between the gates of the second transistor 310 and the shared transistor 40 and the output terminal 150. This may allow saving biasing circuitry which may otherwise be required, consuming additional area and increasing complexity of an amplifier circuit.

In terms of the structure, the example of FIG. 2 may also be summarized as an amplifier circuit 100 comprising a first amplifier stage 20 and a second amplifier stage 30, each comprising two devices or transistors in series. The first amplifier stage 20 comprises a first transistor 210 and the shared transistor 40. The first transistor 210 is coupled to an input terminal 120 of the amplifier circuit 10. The shared transistor 40 is coupled between the first transistor 210 and an output terminal 150 of the amplifier circuit 10. The second amplifier stage 30 comprises a second transistor 310 coupled between a supply voltage and the shared transistor 40. The amplifier circuit 10 may be summarized as being configured to receive an input signal and to amplify the signal so as to provide an output signal having an increased power to a subsequent device. For example, a subsequent mixer stage may be connected to the output terminal 150 of the amplifier circuit 10.

As illustrated in the example of FIG. 1, the gate of the first transistor 210 is coupled to the input terminal 120, while the drain of the first transistor 210 is coupled to a source of the shared transistor 40. The source of the first transistor 210 is coupled to ground. The drain of the shared transistor 40 is coupled to the output terminal 150 and to the drain of the second transistor 310. The source of the second transistor 310 is coupled to a supply voltage. The gates of the shared transistor 40 and the second transistor 310 may, for example, alternatively be coupled to separate associated bias voltage circuitry or the like, when the optional first resistor 140 illustrated in dashed lines would not be present.

The shared transistor 40 and the second transistor 310 of the examples illustrated using the optional resistor 140 illustrated in dashed lines are self-biased. This may, for example, avoid additional biasing circuitry, e.g. common-mode feedback circuitry. As illustrated in FIG. 2, this self-biasing may, for example, be achieved in that the gate of the second transistor 310 is coupled to a first node 162 while the gate of shared transistor 40 is also coupled to the first node 162. The first node 162 is coupled, via the first resistor 140, to the output terminal 150. By self-biasing, the operating point is self-stabilized, relaxing the circuit complexity and providing a higher dynamic range or head room within the amplifier circuit and enhanced linearity.

In the particular example of FIG. 2, the first transistor 210 is an NMOS-FET, the shared transistor 40 is an NMOS-FET and the third transistor 310 is a PMOS-FET. According to further examples, however, the transistors described herein may be provided with complementary technology.

The examples of amplifier circuits in FIGS. 3 to 6 differs from the example of FIG. 2 mainly in that different input amplifiers are used within the first amplifier stage 10, while the basic principles regarding the dual use of the shared transistor 40 are similar or identical. Therefore, the following description of those examples will focus in the difference with respect to the example of FIG. 2, while the same reference numbers are used for identical components or functionality.

In the example of FIG. 2, a first transistor (in particular, an NMOS-Fet) is used as an input amplifier 210 within the first amplifier stage 20. The NMOS-Fet is operated in a common source configuration, which is inherently inverting so that the signal at an output of the input amplifier is inverted with respect to an input signal at the input terminal. Consequently, the phase requirements for the signal to drive the second amplifier stage 30 are identical to the example of FIG. 2. Like in FIG. 2 the driving signal 160 to drive the second amplifier stage 30 is, therefore, tapped from the input of the first amplifier stage 120 via a coupling capacitance 220 so that the signal to drive the second amplifier stage 30 is inverted with respect to an output of the input amplifier 210.

Figure 3:
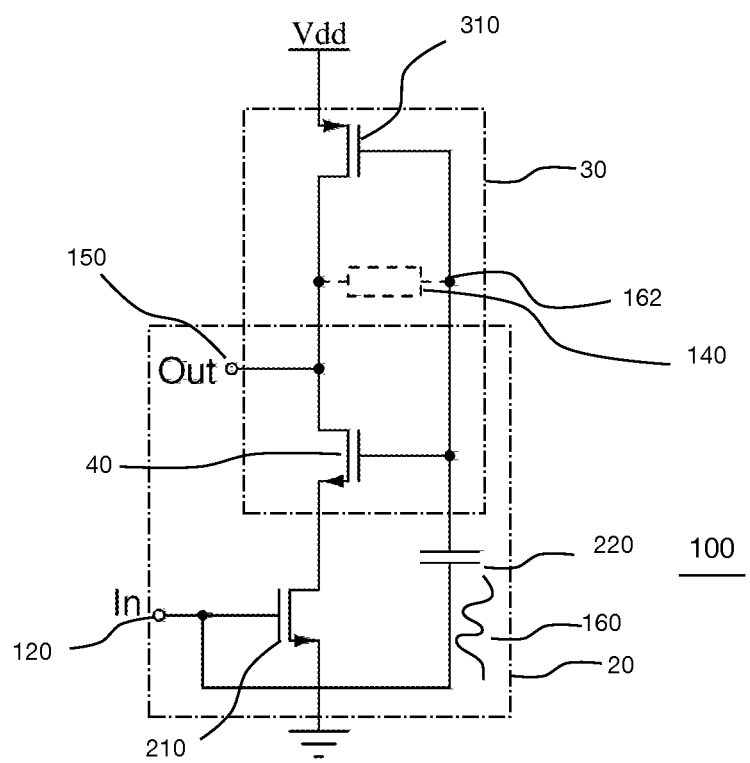
FIG. 3 shows a further example of an amplifier circuit using an NMOS transistor in common source configuration as an input amplifier.
Figure 4:
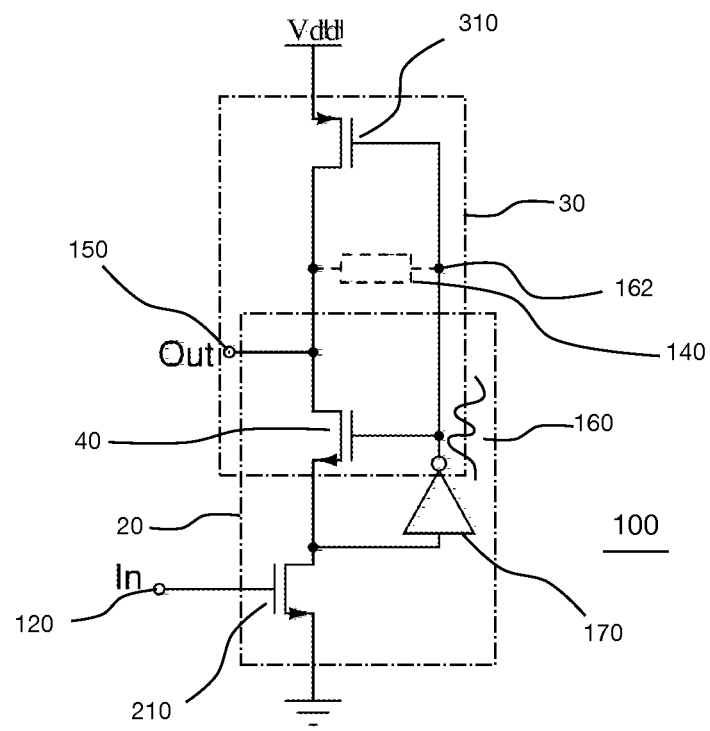
FIG. 4 shows a further example of an amplifier circuit generating a driving signal to drive a second amplifier stage from within a first amplifier stage.

The example of FIG. 4. is equal to the example of FIG. 3 except that the driving signal 160 is tapped from the drain of first transistor 210 constituting the input amplifier. To achieve the same phase characteristic for the driving signal 160 as in the example of FIG. 3, an inverter 170 or an inverting amplifier is used to invert the signal tapped from the drain of the first transistor 210 so as to provide an appropriate driving signal 160.

Figure 5:
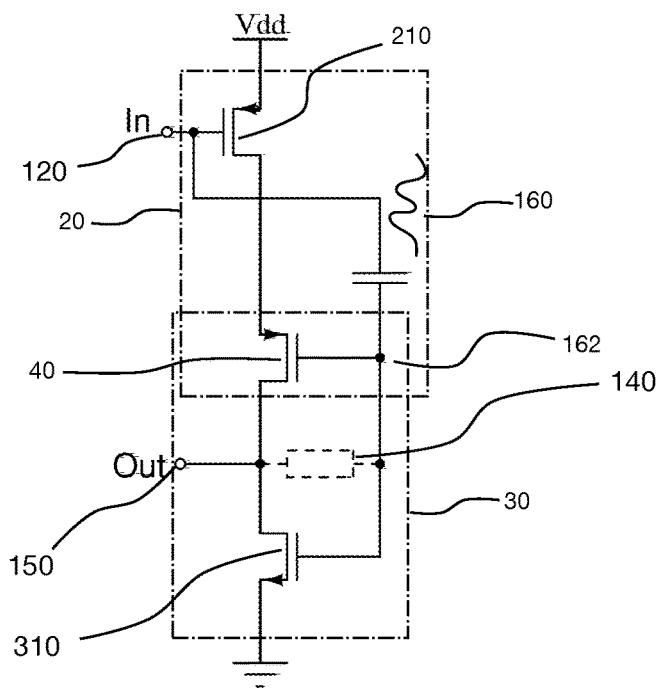
FIG. 5 shows a further example of an amplifier circuit having a first amplifier stage using a PMOS transistor in common source configuration as an input amplifier.

The example of FIG. 5. is similar to the example of FIG. 3. and differs from the example of FIG. 3 only in that a PMOS-Fet is used as an input amplifier 210 within the first amplifier stage 20. The PMOS-Fet is also operated in Common source mode and, therefore, the generation or tapping of the driving signal 160 is identical to the one illustrated in FIG. 3. In further examples, it may also be performed like in the example of FIG. 4.

Figure 6:
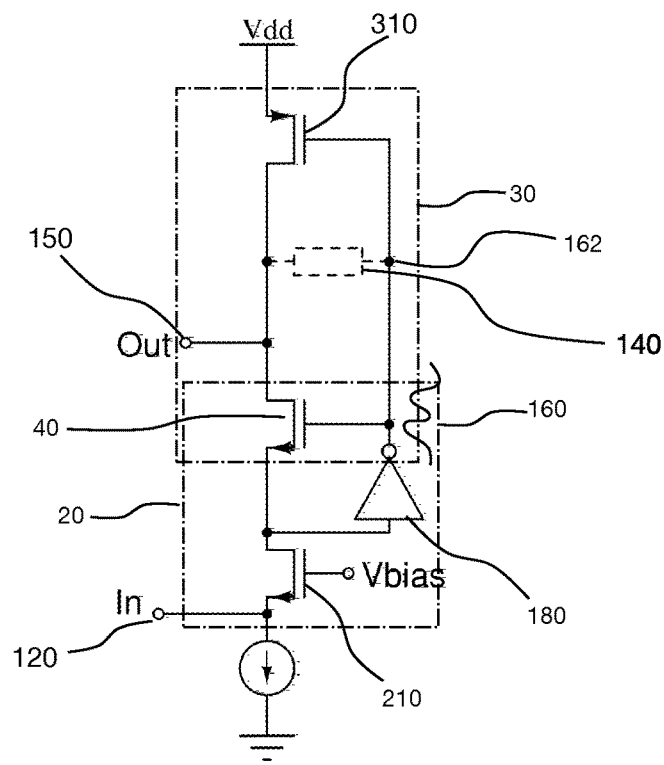
FIG. 6 shows a further example of an amplifier circuit having an input amplifier in common gate configuration.

The example of FIG. 6 is based on the example of FIG. 3 and differs from this example in that a NMOS-FET in common gate mode is used as an input amplifier 210 within the first amplifier stage 20. Since the input amplifier 210 of this example is, therefore, not inverting, an inverter 180 or an inverting amplifier is present to invert the signal tapped from the drain of the NMOS-FET forming the input amplifier 210 to provide the driving signal 160 such that it provides the required inverted phase with respect to the signal provided to the source of the shared transistor 40.

While the examples of the previous figs. illustrate single ended circuits, the following figs. disclose differential amplifier circuits incorporating the concept of sharing a transistor between amplifier stages of the differential amplifier circuits. The differential amplifier circuits are mainly based on the parallel use of single ended amplifier circuits as illustrated before and, consequently, identical reference number will subsequently be used for the components having the same or similar functionality within one of the single ended implementations and within one of the parallel amplifier circuits within the following differential amplifier circuits.

Figure 7:
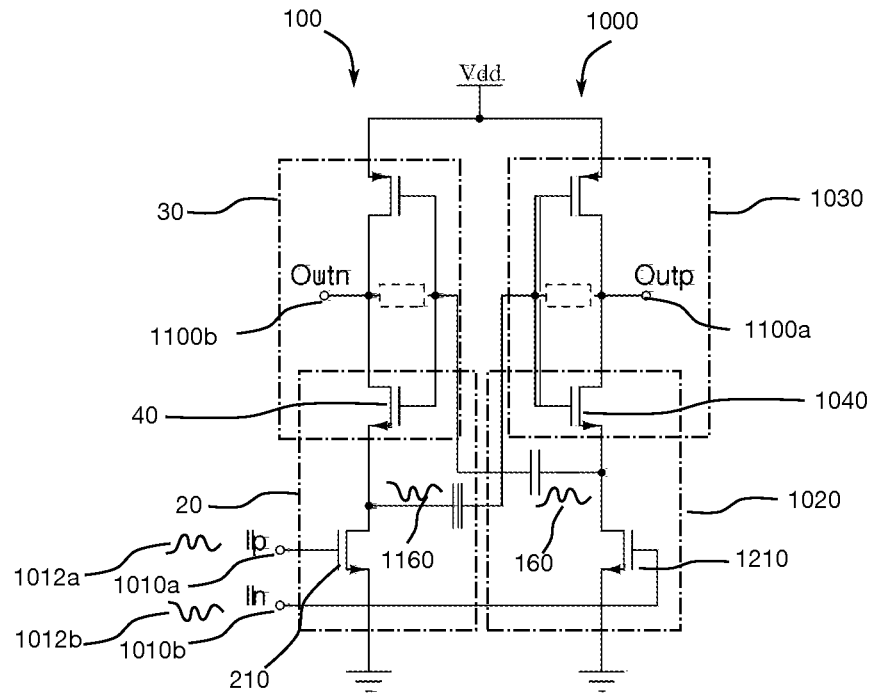
FIG. 7 shows an example of a differential amplifier circuit having two amplifier circuits.

The example of FIG. 7 is based on the parallel use of the example illustrated in FIG. 4 and essentially comprises two amplifier circuits according the example of FIG. 4 in parallel as a first amplifier circuit 100 and a second amplifier circuit 1000. The differential amplifier circuit of FIG. 7 comprises a first input terminal 1010a constituting a positive input and a second input terminal 1010b being a negative input. Likewise, a first output terminal 1100a is a positive output and a second output terminal 1100b forms a negative output.

A differential amplifier circuit based on the previously described concept may generally be defined as comprising a first amplifier circuit 100 and a second amplifier circuit 1000. The first amplifier circuit 100 comprises a first amplifier stage 20 contributing to a power of a first amplified signal and a second amplifier stage 30 contributing to the power of the first amplified signal. The first amplifier stage 20 and the second amplifier stage 30 share a first shared transistor 40. The second amplifier circuit 1000 comprises a third amplifier stage 1020 contributing to a power of a second amplified signal and a fourth amplifier stage 1030 contributing to the power of the second amplified signal. The third amplifier stage 1020 and the fourth amplifier stage 1030 share a second shared transistor 1040.

In the event of a differential amplifier stage, however, one may additionally benefit from the simultaneous presence of inverted signal pairs within the two amplifier circuits 100 and 1000 to provide the driving signals for the second amplifier stages of each of the amplifier circuits 100 and 1000 more efficiently, possibly avoiding the necessity to introduce additional hardware to provide for the required driving signals. In FIG. 7, a first driving 160 signal to drive the second amplifier stage 30 of the first amplifier circuit 100 is tapped from the third amplifier stage 1020 of the second amplifier circuit 1000. In other words, the first amplifier circuit 100 and the second amplifier circuit 1000 are cross coupled. In particular, the first driving signal 160 is tapped from an output of an input amplifier 1210 of the third amplifier stage 1210, which is, in the present example, an NMOS-FET in common source configuration. That is, the input amplifier 1210 is an inverting amplifier and the driving signal 160 at its output is inverted with respect to a negative input signal 1012b at the second input terminal 1010b which is inverted with respect to a positive input signal 1012a at the second input terminal 1010a. Due to the differential input signals 1012a and 1012b and the inversion of the input amplifier 1210, the first driving signal 160 tapped from the output of the input amplifier 1210 to drive the second amplifier stage 30 of the first amplifier circuit 100 is inverse to the signal at an output of the input amplifier 210 of the first amplifier stage 20, which is also used as a second driving signal for the fourth amplifier stage 1030 of the second amplifier circuit 1000. By the described cross coupling between the two amplifier circuits, the required inverse phases of the signals at the source and the gates of the shared transistors 40 and 1040 is provided without the need for additional circuitry, as for example for additional inverters. Further, in cross coupling the first and second amplifier circuits 100 and 1000, the balance of the differential amplifier may be increased as compared to an alternative approach where the driving signals are tapped from within each of the amplifier circuits 100 and 1000.

Figure 8:
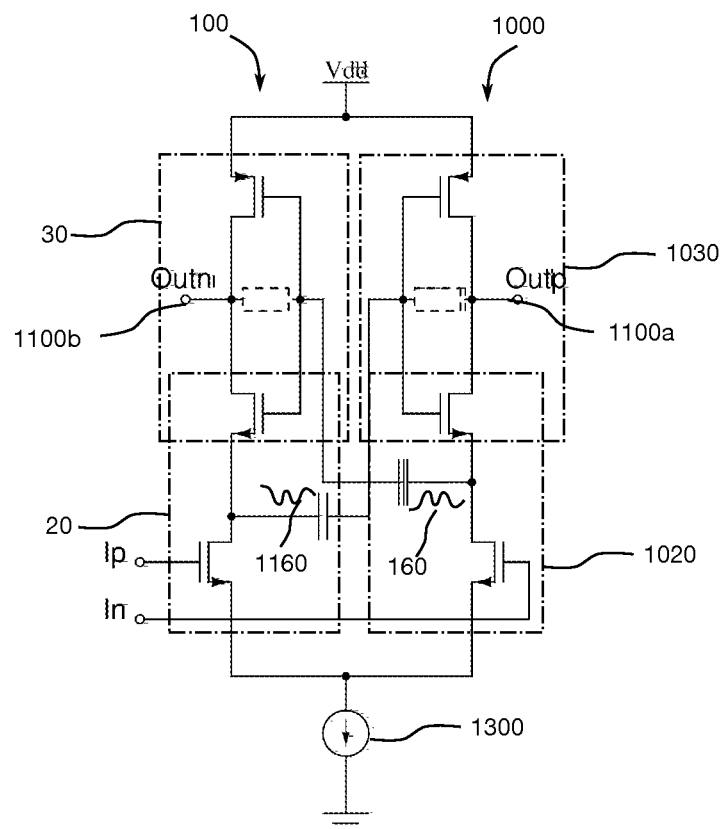
FIG. 8 shows a further example of a differential amplifier circuit using a current source to actively balance the two amplifier circuits.

The example of FIG. 8 corresponds to the example of FIG. 7. However, instead of directly connecting the sources of the input amplifiers 210 and 1210 to ground, a current source 1300 is used to actively balance the two amplifier circuits 100 and 1000 so that a quality of a differential output signal provided at output terminals 1100a and 1100b may be increased.

Figure 9:
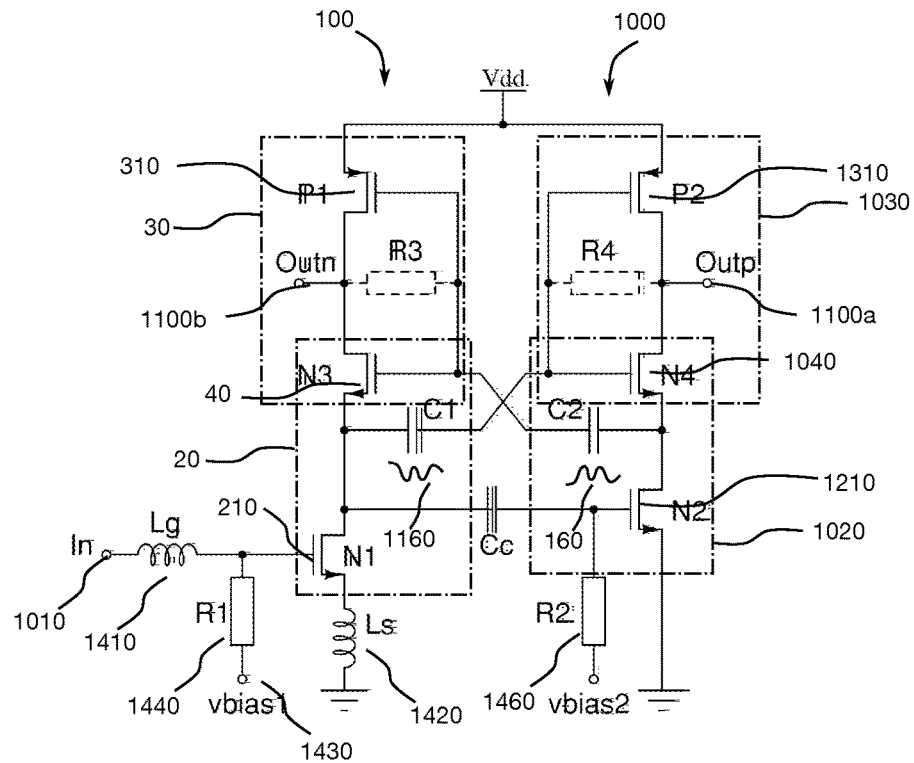
FIG. 9 shows a further example of a differential amplifier circuit having a single ended signal input.

The example of FIG. 9 corresponds to the example of FIG. 7 with respect to the generation or tapping of the first and second driving signals 160 and 1160. However, the example of FIG. 9 has only one input terminal 1010 and generates the inverted signal by using the inherently inverting property of the input amplifier 210. To this end, the drain of the input amplifier 210 is coupled to the gate of the second input amplifier 1210. Since the output of the input amplifier 210 is the inverse to the signal at the input terminal 1010, automatic single ended to differential conversion is achieved additionally by means of the example of FIG. 9.

In other words, FIG. 9 illustrates a further example of a differential amplifier circuit additionally converting a single-ended input signal into a differential output signal. The amplifier circuit illustrated in FIG. 9 is essentially composed of two of the amplifier circuits illustrated in FIG. 3.

The differential amplifier circuit of FIG. 9 comprises a further amplifier circuit 1000 comprising a third amplifier stage 1020 having a third transistor 1210 and a fourth amplifier stage 1030 having a fourth transistor 1310. The third amplifier stage 1020 and the fourth amplifier stage 1030 share the second shared transistor 1040. The gate of the second shared transistor 1040 is AC-coupled to the drain of the first transistor 210. The first transistor constituting the input amplifier 210 of the first amplifier stage 20 and the third transistor constituting the input amplifier 1210 of the third amplifier stage 1020 are operated in common-source configuration. An optional gate inductor 1410 and a source inductor 1420 may be used for simultaneous noise and power matching of the first transistor 210. This may achieve a low noise performance at a low current consumption. A bias point or operating point of the first transistor 210 may be set by a bias potential 1430 applied via a bias resistor 1440. The first transistor 210 operated in common source mode is inherently inverting, i.e., the polarity of the signal provided at the input terminal 1010 is flipped or changed by 180° at the drain of the first transistor 210. The shared transistor 40 in common gate mode does not change the polarity. Since the drain of the first transistor 210 is coupled to the gate of the third transistor 1210, the signal provided at the drain of the third transistor 1210 is inverted with respect to the signal of the drain of the first transistor 210 and, hence, in phase with the signal input at the input terminal 1010. Since also the second shared transistor 1040 in common gate mode does not invert the signal, complementary phases are provided at the first output terminal 1100a and the second output 1100b and so the amplifier circuit of FIG. 9 further converts a single-ended signal to a differential signal.

Single-ended signal input may, for example, be preferred when transferring a signal into a chip or semiconductor chip package due to the reduced number of contacts or package balls. Further, less layout space may be required on the printed circuit board and in the package itself. This may, for example, also result in less self-generated noise, in lower current consumption and reduced overall chip area. On chip, differential signaling may be preferred due to the improved dynamic range, common mode noise rejection, doubling the signal swing and inherently lower even order harmonics. Realizing inherent single-ended to differential conversion as in the example of FIG. 9 may avoid using expensive and bulky external balun (balanced-unbalanced) surface mount components on a Printed Circuit Board (PCB). Also from this perspective it may be advantageous to realize the single-ended input into differential output conversion at one of the first stages in an integrated amplifier or within an integrated amplifier chain within a receiver or the like.

In the particular example of FIG. 9, the drain of the first transistor 210 is AC-coupled to the gate of the third transistor 1210 via a coupling capacitor to allow for the possibility of setting the biasing point or operating point of the third transistor 1210 independently via a further biasing resistor 1460. The output signals of the first transistor 210 and the third transistor 1210 are forwarded to the first and second shared transistors 40 and 1040. That is, the drain terminals of the first transistor 210 and the third transistor 1210 are coupled to the source terminals of the first and second shared transistors 40 and 1040, respectively.

Further, the first and second shared transistors 40 and 1040 are cross coupled, in particular, the source of the second shared transistor 1040 is coupled to the gate of first shared transistors 40 via a capacitor and the source of the first shared transistors 40 is coupled to the gate of the second shared transistors 1040 via a further capacitor. Cross coupling the shared transistors of the two amplifier circuits 100 and 1000 may improve the phase and amplitude balance of the output signal provided between the output terminals 1100a and 1100b. In other words, examples of differential amplifier circuits may have the capability to provide a differential output signal with high signal quality.

The second and fourth transistors 310 and 1310 (the PMOS-transistors P1 and P2) act as loads. The transistors 310 and 40, as well as the transistors 1310 and 1040 are self-biased using the first resistors coupled between the gate terminals of the transistors and the respective output terminal. This may result in a feature that the operating point is self-stabilized, which may relax the circuit complexity and improve headroom along the branch and therefore linearity of the circuit. In the particular example of FIG. 2, the operating point is stabilized based on the value of the supply voltage, the value of the gate-source voltage of the first transistor 210 and the third transistor 1210, which define the current and the drain-source voltages along each branch, i.e. within each amplifier circuit 100 and 1100, as well as on the ratio of the transistor widths.

In the example of FIG. 9, the current-reusing NMOS/PMOS transistor pairs 40 and 310 as well as 1040 and 1310 may be used to drive a current into a following mixer stage, hence providing the properties of a transconductance amplifier. Further, all transistors within each path or amplifier circuit 100 and 1000 use the same DC-current, which may save additional current sources as compared to prior art implementations requiring separate current sources for cascaded amplifier circuits. Due to the integrated single-ended to differential conversion using a bulky passive on-chip transformer may be saved. This, in turn, may result in a significant chip area reduction, which may be important in particular in mobile applications.

In summary, the example of FIG. 9 uses two common-source amplifiers or transistors, whose output signals are balanced using a capacitor cross-coupled structure. The cross-coupled structure serves simultaneously as a cascode circuit increasing the gain of the common-source amplifier transistors. It further serves as a transconductance stage, used to drive current into a subsequent passive mixer, which may be connected to the output terminals 1100a and 1100b. It further serves as a current re-using amplifier to save current and as a self-biasing load to avoid common-mode feedback circuitry. At the same time, an accurate single-ended to differential conversion may be provided, without the necessity of using bulky on-chip passive transformers which might otherwise consume large chip area. As compared to conventional solutions using capacitor-cross-coupled cascodes together with a passive load, the examples described herein propose to share a single transistor used within a cross-coupling cascode and within a transconductance stage, the transconductance stage acting as a PMOS load at the same time. Further, the circuit sets its own operating point by means of NMOS and PMOS structures, without the need for further common mode feedback circuitry, which may furthermore result in a reduced complexity of the circuitry and in reduced chip area and power consumption.

Figure 10:
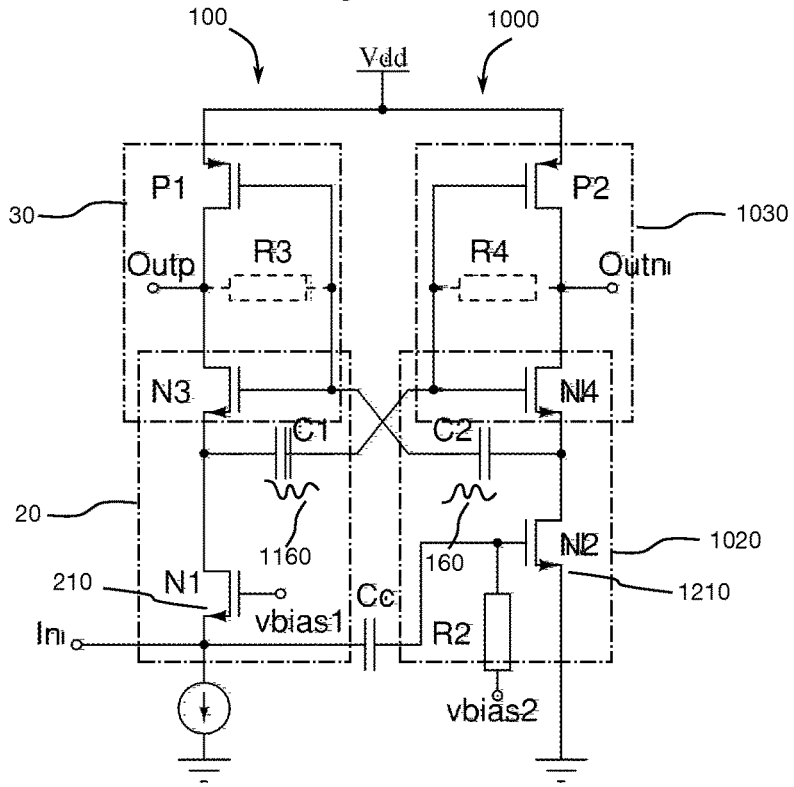
FIG. 10 shows a further example of a differential amplifier circuit having a single ended signal input and different input amplifier configurations within the two amplifier circuits.

The example of FIG. 10 further emphasizes the flexibility of the use of examples described herein in that it illustrates that not even input amplifiers operating according to an identical operating mode are required within examples of differential amplifiers. While the first input amplifier 210 is an NMOS-FET operating in common source mode, the second input amplifier 1210 is an NMOS FET operating in common gate mode. Using different operating modes for the input amplifiers within a differential amplifier may, for example, serve to tailor the input characteristic of examples of differential amplifiers to nearly arbitrary environments.

Examples of amplifier circuits as described herein may be used in receiver circuits for arbitrary wireless transmission schemes. For example, a radiofrequency receiver comprising an amplifier circuit as described herein may be used in receivers or mobile devices configured to operate according to the LTE, GSM, Bluetooth, wireless LAN (WLAN), FM radio, 60 GHz as well as global navigation satellite systems (GNSS) receivers. Further use cases are receivers for other systems. Examples for those systems may be another one of the 3GPP-standardized mobile communication networks or mobile communication systems. The mobile or wireless communication system may correspond to, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN), or mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc. Further examples of receiver systems or tuning circuits may also be used in connection with other wireless communication standards or protocols, such as for example Bluetooth, ZIGBEE or the like.

Figure 11:
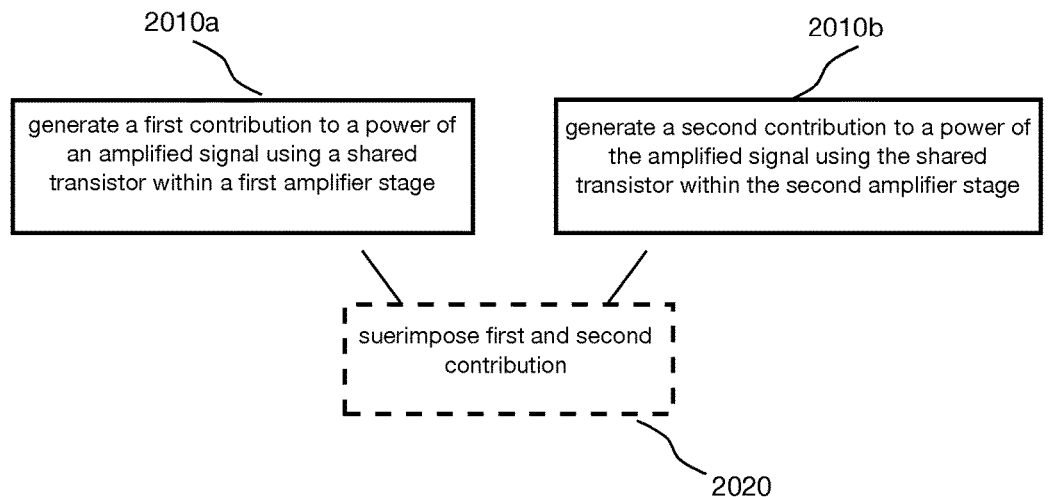
FIG. 11 shows a flow chart of an example of a method for generating an amplified signal.

FIG. 11 schematically illustrates an example of a method for by means of a flow chart. The method for generating an amplified signal comprises generating (2101a) a first contribution to a power of the amplified signal using a transistor within a first amplifier stage; and generating (2010b) a second contribution to a power of the amplified signal using the same transistor within a second amplifier stage.

FIG. 11 further illustrates the optional step of superimposing (2020) the first contribution of the first amplifier stage and the second contribution of the second amplifier stage such they are superimposed in phase.

Figure 12:
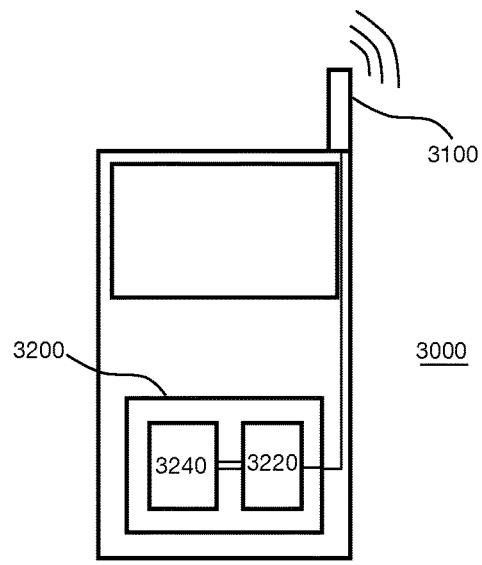
FIG. 12 schematically illustrates a mobile telecommunications device.

FIG. 12 schematically illustrates a mobile telecommunications device or mobile handset 3000 comprising a radiofrequency receiver 3200 in order to process a wirelessly received signal as received by means of an antenna 3100 of the mobile telecommunications device 3000. The radiofrequency receiver 3200 comprises an amplifier circuit 3220 at a first amplification stage, at the same time converting the single ended input signal to a differential output signal to be input to a mixing stage 3240 of the radiofrequency receiver 3200. The mixing stage down-converts or down-mixes the received signal to a baseband for further processing within the mobile telecommunications device 3000.

What is claimed is:

Example 1 is an amplifier circuit, comprising a first amplifier stage contributing to a power of an amplified signal and a second amplifier stage contributing to the power of the amplified signal; wherein the first amplifier stage and the second amplifier stage share a transistor.

In example 1, the amplifier circuit is optionally configured to tap a driving signal from the first amplifier stage to drive the second amplifier stage.

In example 3, the transistor of example 1 or 2 is used in a common gate mode within the first amplifier stage and in a common source mode within the second amplifier stage.

In example 4, the first amplifier stage of any of examples 1 to 3 optionally comprises an input amplifier having an output coupled to a source of the shared transistor.

In example 5, the input amplifier of any of the preceding examples optionally is an inverting amplifier or a non-inverting amplifier.

In example 6, the driving signal of examples 4 or 5 is tapped from the first amplifier stage to drive the second amplifier stage is inverted with respect to a signal output by the input amplifier.

In example 7, in the amplifier circuit of any of the preceding examples, the first amplifier stage corresponds to a cascode stage; and the second amplifier stage corresponds to a transconductance stage.

In example 8, the amplifier circuit of any of the preceding examples comprises a first transistor coupled to an input terminal of the amplifier circuit, the first transistor being part of the first amplifier stage; a second transistor coupled to a supply voltage, the second transistor being part of the second amplifier stage; wherein the transistor is coupled between the first transistor and the second transistor.

In example 9, a gate of the first transistor of the amplifier circuit of example 8, wherein is coupled to the input terminal and wherein a drain of the first transistor is coupled to a source of the shared transistor.

In example 10, the amplifier circuit of example 9 is configured to tap a driving signal from the drain of the first transistor to drive the second amplifier stage In example 11, a drain of the shared transistor of examples 8 to 10 is coupled to an output terminal of the amplifier stage and to a drain of the second transistor.

In example 12, the shared transistor and the second transistor of examples 8 to 11 are self biased.

In example 13, in the amplifier circuit of example 9, a gate of the second transistor is coupled to a first node; a gate of the shared transistor is coupled to the first node; and the first node is coupled to the output terminal via a first resistor.

In example 14, the first transistor and the shared transistor of any of the preceding examples are N-MOS Field effect transistors and wherein the third transistor is a P-MOS Field effect transistor.

Example 15 is a differential amplifier circuit, comprising: a first amplifier circuit, comprising: a first amplifier stage contributing to a power of a first amplified signal; a second amplifier stage contributing to the power of the first amplified signal; wherein the first amplifier stage and the second amplifier stage share a first transistor; a second amplifier circuit, comprising: a third amplifier stage contributing to a power of a second amplified signal; a fourth amplifier stage contributing to the power of the second amplified signal; wherein the third amplifier stage and the fourth amplifier stage share a second transistor.

In example 16, the first amplifier circuit and the second amplifier circuit of the differential amplifier circuit of example 15 are cross coupled.

In example 17 in the differential amplifier circuit of example 16, the first amplifier circuit is configured to tap a first driving signal from the third amplifier stage to drive the second amplifier stage, and wherein the second amplifier circuit is configured to tap a second driving signal from the first amplifier stage to drive the fourth amplifier stage.

In example 18, in the differential amplifier circuit of examples 15 to 17: the first amplifier circuit comprises: a first transistor coupled to an input terminal of the differential amplifier circuit, the first transistor being part of the first amplifier stage; a second transistor coupled to a supply voltage, the second transistor being part of the second amplifier stage; wherein the shared transistor is coupled between the first amplifier stage and the second amplifier stage; and the second amplifier circuit comprises: a third transistor coupled to an input terminal of the differential amplifier circuit, the third transistor being part of the third amplifier stage; a fourth transistor coupled to the supply voltage, the fourth transistor being part of the fourth amplifier stage; wherein the second shared transistor is coupled between the third transistor and the fourth transistor.

In example 19, in the differential amplifier circuit of example 18: a drain of the first transistor is coupled to a source of the first shared transistor; a drain of the first shared transistor is coupled to an output terminal and to a drain of the second transistor; a drain of the third transistor is coupled to a source of the second shared transistor; and a drain of the second shared transistor is coupled to a further output terminal and to a drain of the fourth transistor.

In example 20, the first driving signal used to drive the second amplifier stage in example 19 is tapped from the drain of the third transistor; and wherein the second further driving signal used to drive the fourth amplifier stage in example 19 is tapped from the drain of the first transistor Example 21 is a Radio Frequency receiver comprising an amplifier circuit or a differential amplifier circuit of any of the preceding examples.

In example 22 the Radio Frequency receiver of example 21 optionally further comprises a mixing stage coupled to an output terminal of the amplifier circuit.

Example 23 is a Mobile telecommunications device comprising a Radio Frequency Receiver of any of examples 21 or 22.

Example 24 is a method for generating an amplified signal, comprising: generating a first contribution to a power of the amplified signal using a shared transistor within a first amplifier stage; and generating a second contribution to a power of the amplified signal using the shared transistor within a second amplifier stage.

In example 25, the method of example 24 optionally further comprises: using the shared transistor in a common gate mode as well as in a common source mode.

In example 26, the method of examples 24 or 25, further comprises: deriving a driving signal for the second amplifier stage using a signal tapped from the first amplifier stage.

In example 27, the method of example 26 optionally further comprises: deriving the driving signal for the second amplifier stage such that the contribution of the first amplifier stage and the contribution of the second amplifier stage are in phase.

In example 28, the driving signal for the second amplifier stage of the method of example 27 is derived such that it is inverted with respect to an output signal of an input amplifier of the first amplifier stage.

In example 29, the method of any of examples 25 to 28 optionally further comprises: deriving an input for the common source operation mode of the shared transistor using an input for the common gate operation mode of the shared transistor.

In example 30, deriving an input for the common source operation mode of the method of example 29 optionally further comprises applying a phase shift of 180° to the input for the common gate mode.

The previous description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. An amplifier circuit, comprising:
    a first amplifier stage contributing to a power of an amplified signal;
    a second amplifier stage contributing to the power of the amplified signal;
    wherein the first amplifier stage and the second amplifier stage share a transistor,
    a first transistor coupled to an input terminal of the amplifier circuit, the first transistor being part of the first amplifier stage;
    a second transistor coupled to a supply voltage, the second transistor being part of the second amplifier stage;
    wherein the transistor is coupled between the first transistor and the second transistor, and
    wherein a drain of the transistor that is shared is coupled to an output terminal of the amplifier stage and to a drain of the second transistor.

2. The amplifier circuit of claim 1, wherein the amplifier circuit is configured to tap a driving signal from the first amplifier stage to drive the second amplifier stage.

3. The amplifier circuit of claim 1, wherein the transistor is used in a common gate mode within the first amplifier stage and in a common source mode within the second amplifier stage.

4. The amplifier circuit of claim 1, wherein the first amplifier stage comprises an input amplifier having an output coupled to a source of the shared transistor.

5. The amplifier circuit of claim 4, wherein the input amplifier is an inverting amplifier or a non inverting amplifier.

6. The amplifier circuit of claim 4, wherein a signal tapped from the first amplifier stage to drive the second amplifier stage comprises a driving signal and is inverted with respect to a signal output by the input amplifier.

7. The amplifier circuit of claim 1, wherein
    the first amplifier stage corresponds to a cascode stage; and
    the second amplifier stage corresponds to a transconductance stage.

8. The amplifier circuit of claim 1, wherein a gate of the first transistor is coupled to the input terminal and wherein a drain of the first transistor is coupled to a source of the transistor that is shared.

9. The amplifier circuit of claim 8, wherein the amplifier circuit is configured to tap a driving signal from the drain of the first transistor to drive the second amplifier stage.

10. The amplifier circuit of claim 1, wherein the transistor that is shared and the second transistor are self biased.

11. An amplifier circuit, comprising:
    a first amplifier stage contributing to a power of an amplified signal;
    a second amplifier stage contributing to the power of the amplified signal; wherein the first amplifier stage and the second amplifier stage share a transistor
    a first transistor coupled to an input terminal of the amplifier circuit, the first transistor being part of the first amplifier stage;
    a second transistor coupled to a supply voltage, the second transistor being part of the second amplifier stage;
    wherein the transistor is coupled between the first transistor and the second transistor,
    wherein a gate of the first transistor is coupled to the input terminal and wherein a drain of the first transistor is coupled to a source of the transistor that is shared, and wherein
    a gate of the second transistor is coupled to a first node;
    a gate of the transistor that is shared is coupled to the first node; and
    the first node is coupled to the output terminal via a first resistor.

12. The amplifier circuit of claim 1, wherein the first transistor and the that is shared transistor are N-MOS Field effect transistors and wherein the second transistor is a P-MOS Field effect transistor.

13. A differential amplifier circuit, comprising:
a first amplifier circuit, comprising:
a first amplifier stage contributing to a power of a first amplified signal;
a second amplifier stage contributing to the power of the first amplified signal;
wherein the first amplifier stage and the second amplifier stage share a first transistor;
a second amplifier circuit, comprising:
a third amplifier stage contributing to a power of a second amplified signal;
a fourth amplifier stage contributing to the power of the second amplified signal;
wherein the third amplifier stage and the fourth amplifier stage share a second transistor,
wherein the first amplifier circuit and the second amplifier circuit are cross coupled,
wherein the first amplifier circuit is configured to tap a first driving signal from the third amplifier stage to drive the second amplifier stage, and
wherein the second amplifier circuit is configured to tap a second driving signal from the first amplifier stage to drive the fourth amplifier stage.

14. A differential amplifier circuit, comprising:
a first amplifier circuit, comprising:
  a first amplifier stage contributing to a power of a first amplified signal;
  a second amplifier stage contributing to the power of the first amplified signal;
  wherein the first amplifier stage and the second amplifier stage share a first amplifier circuit transistor;
a second amplifier circuit, comprising:
  a third amplifier stage contributing to a power of a second amplified signal;
  a fourth amplifier stage contributing to the power of the second amplified signal;
  wherein the third amplifier stage and the fourth amplifier stage share a second amplifier circuit transistor,
wherein the first amplifier circuit further comprises:
  a first transistor coupled to an input terminal of the differential amplifier circuit, the first transistor being part of the first amplifier stage;
  a second transistor coupled to a supply voltage, the second transistor being part of the second amplifier stage;
  wherein the first amplifier circuit transistor is coupled between the first amplifier stage and the second amplifier stage; and
wherein the second amplifier circuit further comprises:
  a third transistor coupled to an input terminal of the differential amplifier circuit, the third transistor being part of the third amplifier stage;
  a fourth transistor coupled to the supply voltage, the fourth transistor being part of the fourth amplifier stage;
  wherein the second amplifier circuit transistor is coupled between the third transistor and the fourth transistor,
  wherein the first amplifier circuit transistor comprises a first shared transistor and the second amplifier circuit transistor comprises a second shared transistor.

15. The differential amplifier circuit of claim 14, wherein
a drain of the first transistor is coupled to a source of the first shared transistor;
a drain of the first shared transistor is coupled to an output terminal and to a drain of the second transistor;
a drain of the third transistor is coupled to a source of the second shared transistor; and
a drain of the second shared transistor is coupled to a further output terminal and to a drain of the fourth transistor.

16. The differential amplifier circuit of claim 15,
wherein the first driving signal used to drive the second amplifier stage is tapped from the drain of the third transistor; and
wherein the second further driving signal used to drive the fourth amplifier stage is tapped from the drain of the first transistor.

* * * * *